(12) United States Patent
Shimizu

(10) Patent No.: US 11,844,179 B2
(45) Date of Patent: Dec. 12, 2023

(54) ELECTRONIC COMPONENT SERIES AND BASE TAPE

(71) Applicant: Murata Manufacturing Co., Ltd., Kyoto-fu (JP)

(72) Inventor: Yasuhiro Shimizu, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 349 days.

(21) Appl. No.: 17/063,548

(22) Filed: Oct. 5, 2020

(65) Prior Publication Data

US 2021/0127533 A1    Apr. 29, 2021

(30) Foreign Application Priority Data

Oct. 23, 2019    (JP) .................................. 2019-192407

(51) Int. Cl.
*H05K 13/02*    (2006.01)
*B65B 15/04*    (2006.01)
(Continued)

(52) U.S. Cl.
CPC ........... *H05K 13/022* (2013.01); *B65B 15/04* (2013.01); *H05K 13/0084* (2013.01); *H05K 13/0419* (2018.08)

(58) Field of Classification Search
CPC .... B65D 73/02; H05K 13/02; H05K 13/0084; H05K 13/0419; H05K 13/022
(Continued)

(56) References Cited

U.S. PATENT DOCUMENTS 5,691,038 A * 11/1997 Hirata ................ H05K 13/0084
                                                                  428/354
6,030,692 A *  2/2000 Auger ................ H05K 13/0084
                                                                  428/354
(Continued)

FOREIGN PATENT DOCUMENTS

JP        S61-214414 A    9/1986
JP        S63-23259 U     2/1988
(Continued)

OTHER PUBLICATIONS

An Office Action mailed by the Korean Intellectual Property Office dated Nov. 26, 2021, which corresponds to Korean Patent Application No. 10-2020-0131630 and is related to U.S. Appl. No. 17/063,548 with English language translation.

*Primary Examiner* — Chun Hoi Cheung
(74) *Attorney, Agent, or Firm* — Studebaker & Brackett PC

(57) ABSTRACT

An electronic component series includes a base tape mainly composed of paper and having a multiplicity of accommodation recesses formed continuously at predetermined intervals for accommodating electronic components each having a substantially rectangular parallelepiped shape with an L dimension of less than or equal to 0.6 mm, a W dimension of less than or equal to 0.3 mm, and a T dimension of less than or equal to 0.3 mm; the electronic components accommodated in the accommodation recesses; and a cover tape continuously adhered to a surface of the base tape to cover the accommodation recesses. The electronic components are lifted from the accommodation recesses by peeling off the cover tape. Each of the accommodation recesses has a bottom surface inclined in a range of from 10° to 20° with respect to the surface of the base tape to be deeper toward a downstream in a conveyance direction.

14 Claims, 12 Drawing Sheets

(51) Int. Cl.
*H05K 13/04* (2006.01)
*H05K 13/00* (2006.01)

(58) Field of Classification Search
USPC .................................. 206/713, 494, 725
See application file for complete search history.

(56) References Cited

U.S. PATENT DOCUMENTS

| | | | |
|---|---|---|---|
| 6,536,593 B2* | 3/2003 | Hatakeyama | B65D 73/02 206/725 |
| 6,568,535 B1* | 5/2003 | Pylant | H05K 13/003 206/713 |
| 7,112,305 B2* | 9/2006 | McEntee | B65D 75/327 422/500 |
| 7,584,853 B2* | 9/2009 | Yoshii | H05K 13/0084 206/813 |
| 8,584,859 B2* | 11/2013 | Hiramatsu | H05K 13/0084 428/355 R |
| 10,384,860 B2* | 8/2019 | Arai | B65B 9/045 |
| 2007/0216000 A1* | 9/2007 | Sasamura | H01L 21/67356 257/678 |
| 2021/0105918 A1* | 4/2021 | Shimizu | H05K 13/0084 |

FOREIGN PATENT DOCUMENTS

| | | |
|---|---|---|
| JP | 2003-332788 A | 11/2003 |
| JP | 2012-218793 A | 11/2012 |
| JP | 2017-202841 A | 11/2017 |
| JP | 2018-024473 A | 2/2018 |

* cited by examiner

IV-IV CROSS SECTIONAL VIEW

V-V CROSS SECTIONAL VIEW

VII-VII CROSS SECTIONAL VIEW

VIII-VIII CROSS SECTIONAL VIEW

X-X CROSS SECTIONAL VIEW

XIV-XIV CROSS SECTIONAL VIEW

XV-XV CROSS SECTIONAL VIEW

XVIII-XVIII CROSS SECTIONAL VIEW

XIX-XIX CROSS SECTIONAL VIEW

XXI-XXI CROSS SECTIONAL VIEW

XXIV-XXIV CROSS SECTIONAL VIEW

ELECTRONIC COMPONENT SERIES AND BASE TAPE

CROSS-REFERENCE TO RELATED APPLICATION

This application claims benefit of priority to Japanese Patent Application No. 2019-192407, filed Oct. 23, 2019, the entire content of which is incorporated herein by reference.

BACKGROUND

Technical Field

The present disclosure relates to an electronic component series and a base tape.

Background Art

In recent years, electronic components have been downsized. There have been an increased number of small-sized electronic components having dimensions in longitudinal and lateral directions such as 0.6 mm×0.3 mm (0603 chip), 0.4 mm×0.2 mm (0402 chip), and 0.25 mm×0.125 mm (0201 chip).

A base tape of a conventional electronic component series has a structure in which a plurality of accommodation recesses each having a substantially rectangular parallelepiped shape are provided in a strip-shaped tape main body at equal intervals in a length direction and a multiplicity of feed holes each having a substantially circular shape are provided at equal intervals in the length direction, as described, for example, in Japanese Patent Laying-Open No. 2012-218793. In such an electronic component series for conveying small-sized electronic components, in order to reduce a pickup failure during mounting while ensuring accommodation of the electronic components, a margin between each electronic component and each accommodation recess is made as small as possible and an effort is made with regard to the shape of the accommodation recess.

SUMMARY

Since the margin between the electronic component and the accommodation recess cannot be 0, a margin of about 10% with respect to the width of the electronic component is set. Particularly, when the base tape is composed of paper, a sufficient margin is required due to the following reason: since the base tape itself swells, a failure occurs in accommodating an electronic component into an accommodation recess or an accommodated electronic component is stuck (so-called chip lock), disadvantageously.

On the other hand, pickup nozzles of mounting devices have been also downsized; however, in the case of the above-described small-sized electronic component, the size of each nozzle tends to be larger than the size of the electronic component.

Accordingly, since the position of the electronic component is not fixed in the accommodation recess, the center of the pickup nozzle is likely to be displaced from the center of the electronic component to be suctioned when lifting out the electronic component from the base tape using the pickup nozzle, with the result that the pickup nozzle is shifted from the chip. If mounted in this state, the pickup nozzle interferes with an electronic component previously mounted on a mounting substrate. This may cause a failure of mounting or damage on the previously mounted adjacent electronic component. Particularly, in recent years, mounting substrates for mounting electronic components thereon have been downsized and high-density mounting has been increasingly employed in which a distance between electronic components is small. Hence, the interference of the pickup nozzle with the previously mounted electronic component has become a great problem.

Therefore, the present disclosure provides an electronic component series and a base tape so as to suppress an interference between a previously mounted electronic component and a nozzle when mounting an electronic component while ensuring a margin between the electronic component and an accommodation recess.

An electronic component series according to the present disclosure is an electronic component series including a base tape provided with a multiplicity of accommodation recesses for accommodating electronic components each having a substantially rectangular parallelepiped shape with a length dimension (L dimension) of less than or equal to 0.6 mm, a width dimension (W dimension) of less than or equal to 0.3 mm, and a height dimension (T dimension) of less than or equal to 0.3 mm. The accommodation recesses is formed continuously at predetermined intervals, and the base tape is mainly composed of paper. The electronic component series further includes the electronic components accommodated in the accommodation recesses; and a cover tape continuously adhered to a surface of the base tape so as to cover the accommodation recesses. The electronic components are lifted out from the accommodation recesses by peeling off the cover tape while conveying the base tape in one direction. Each of the accommodation recesses has a bottom surface inclined to be deeper toward a downstream in a conveyance direction, and the bottom surface is inclined in a range of more than 10° and less than or equal to 20° (i.e., from more than 10° to 20°) with respect to the surface of the base tape.

In the electronic component series according to the present disclosure, the bottom surface of the accommodation recess is inclined to be deeper toward the downstream in the conveyance direction, and the bottom surface is inclined in a range of more than 10° and less than or equal to 20° (i.e., from more than 10° to 20°) with respect to the surface of the base tape. Hence, even when the base tape is composed of paper, the electronic component accommodated in the accommodation recess can be self-aligned in the accommodation recess at a predetermined position.

An electronic component series according to the present disclosure is an electronic component series including a base tape provided with a multiplicity of accommodation recesses for accommodating electronic components each having a substantially rectangular parallelepiped shape with a length dimension (L dimension) of less than or equal to 0.6 mm, a width dimension (W dimension) of less than or equal to 0.3 mm, and a height dimension (T dimension) of less than or equal to 0.3 mm. The accommodation recesses is formed continuously at predetermined intervals. The electronic component series further includes the electronic components accommodated in the accommodation recesses; and a cover tape continuously adhered to a surface of the base tape so as to cover the accommodation recesses. The electronic components are lifted out from the accommodation recesses by peeling off the cover tape while conveying the base tape in one direction. Each of the accommodation recesses has a bottom surface having a surface substantially parallel to the surface of the base tape, a first side surface formed at a substantially right angle with respect to the bottom surface on a downstream side in a conveyance direction, and a second side surface formed at a substantially right angle with respect to the bottom surface on an upstream side in the conveyance direction. The bottom surface has a placement portion for placing a corresponding electronic component, and a guiding portion for guiding the electronic component to the placement portion. The guiding portion is provided between the placement portion and at least one of the first side surface and the second side surface, and the guiding portion is an inclined surface inclined by more than or equal to 30° with respect to a surface of the placement portion.

In the electronic component series according to the present disclosure, the bottom surface has the placement portion for placing the electronic component, and the guiding portion for guiding the electronic component to the placement portion. The guiding portion is provided between the placement portion and at least one of the first side surface and the second side surface. The surface of the placement portion is substantially parallel to the surface of the base tape and the guiding portion thus provided is an inclined surface inclined by more than or equal to 30° with respect to the surface of the placement portion. Hence, the electronic component can be self-aligned while maintaining the main surface of the electronic component to be horizontal. Therefore, the electronic component can be stably suctioned by a pickup nozzle, thus resulting in reduced risk of interference in the horizontal direction during mounting.

Therefore, according to the present disclosure, there are provided an electronic component series and a base tape so as to suppress an interference between a previously mounted electronic component and a nozzle when mounting an electronic component while ensuring a margin between the electronic component and an accommodation recess.

The foregoing and other objects, features, aspects and advantages of the present disclosure will become more apparent from the following detailed description of the present disclosure when taken in conjunction with the accompanying drawings.

DETAILED DESCRIPTION

1. First Embodiment (a) Electronic Component Series

Figure 1:
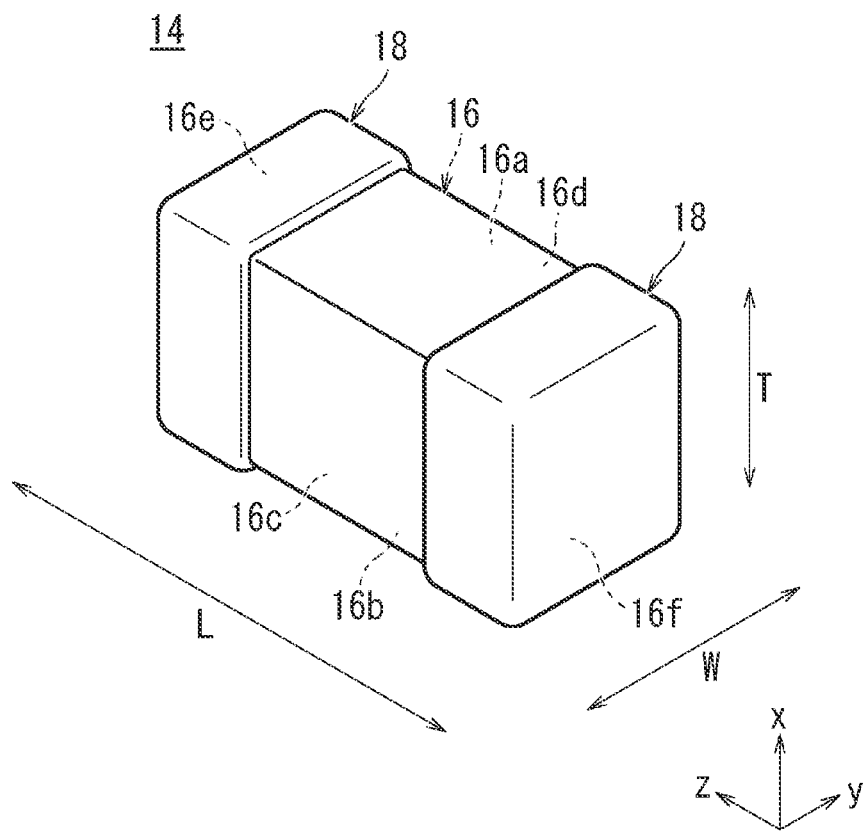
FIG. 1 is a perspective view showing an external appearance of an exemplary electronic component to be accommodated in an electronic component series according to a first embodiment of the present disclosure.
Figure 2:
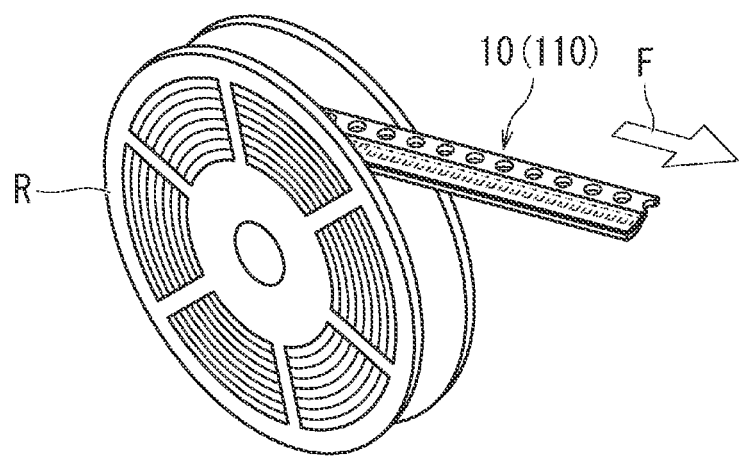
FIG. 2 is a perspective view showing a state in which the electronic component series according to the first embodiment of the present disclosure is wound around a reel.
Figure 3:
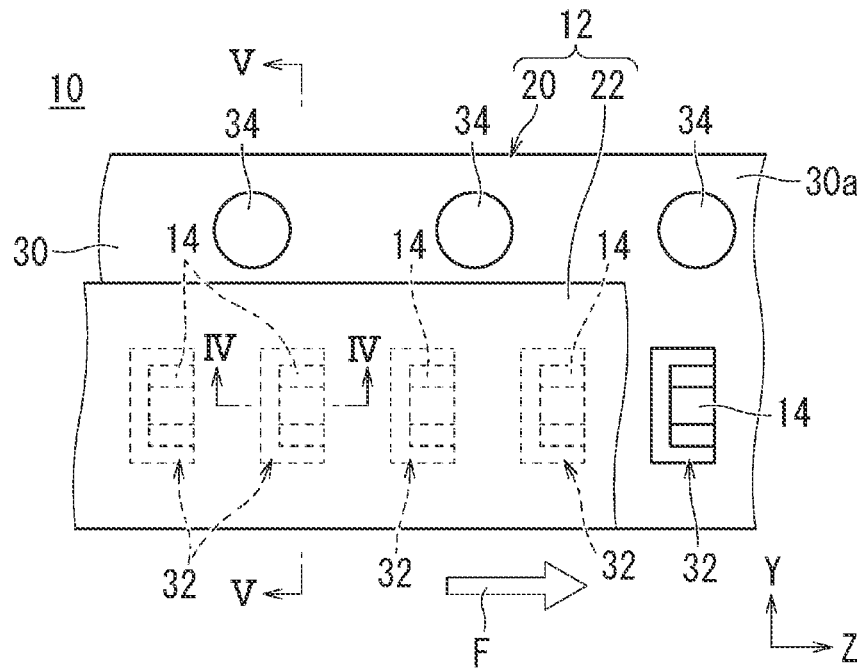
FIG. 3 is a top view showing an external appearance of the electronic component series according to the first embodiment of the present disclosure.
Figure 4:
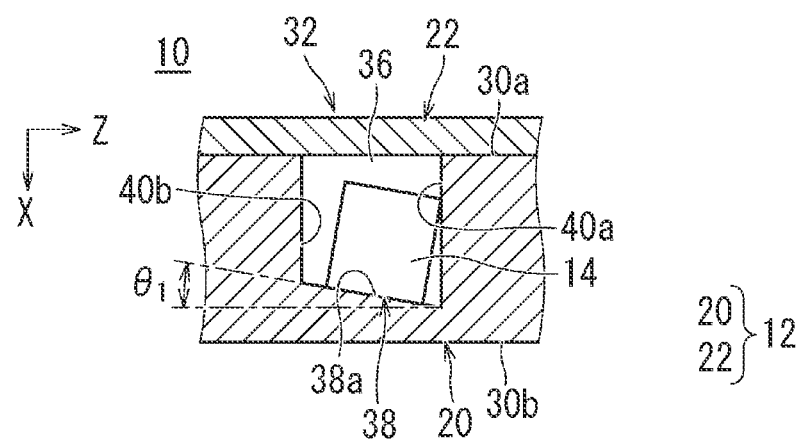
FIG. 4 is a cross sectional view taken along a line IV-IV in FIG. 3.
Figure 5:
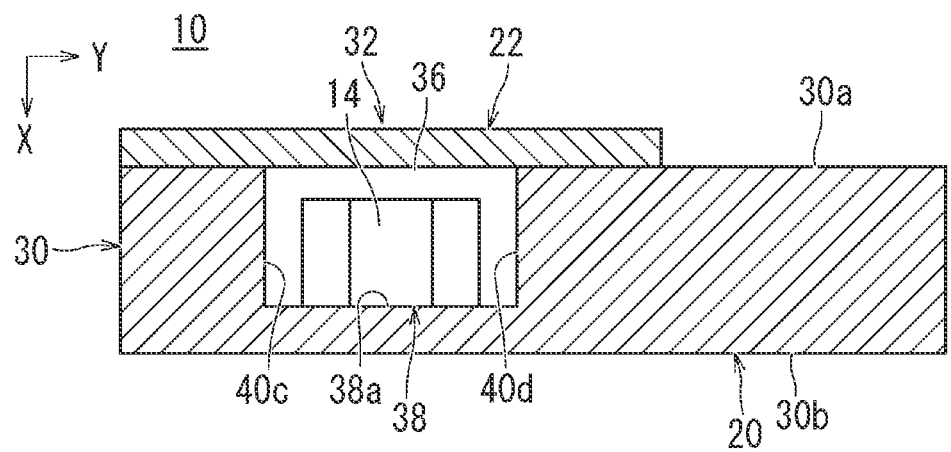
FIG. 5 is a cross sectional view taken along a line V-V in FIG. 3.

FIG. 1 is a perspective view showing an external appearance of an exemplary electronic component to be accommodated in an electronic component series according to a first embodiment of the present disclosure. FIG. 2 is a perspective view showing a state in which the electronic component series according to the first embodiment of the present disclosure is wound around a reel. FIG. 3 is a top view showing an external appearance of the electronic component series according to the first embodiment of the present disclosure. FIG. 4 is a cross sectional view taken along a line IV-IV in FIG. 3. FIG. 5 is a cross sectional view taken along a line V-V in FIG. 3.

As shown in FIG. 3, an electronic component series 10 of the first embodiment includes an electronic component package 12 and an electronic component 14. As shown in FIG. 2, electronic component series 10 is wound around a reel R.

(b) Electronic Component

First, a multilayer ceramic electronic component, which is an exemplary electronic component 14, will be described. FIG. 1 is a perspective view showing an external appearance of electronic component 14. In FIG. 1, the long side direction of an element body is denoted by L, the width direction of the element body is denoted by W, and the thickness direction of the element body is denoted by T.

As shown in FIG. 1, electronic component 14 includes an element body 16 having a rectangular parallelepiped outer shape, and outer electrodes 18 provided at both ends of element body 16. Element body 16 includes a plurality of ceramic layers. In element body 16, a plurality of inner electrode layers (not shown) are embedded.

Element body 16 is formed to have a substantially rectangular parallelepiped shape, and has: a first main surface 16a and a second main surface 16b facing each other in a height direction x; a first side surface 16c and a second side surface 16d facing each other in a width direction y orthogonal to height direction x; and a first end surface 16e and a second end surface 16f facing each other in a length direction z orthogonal to height direction x and width direction y.

When the dimension of electronic component 14 in length direction z is represented as an L dimension, the L dimension is preferably more than or equal to 0.25 mm and less than or equal to 0.6 mm (i.e., from 0.25 mm to 0.6 mm). When the dimension of electronic component 14 in width direction y is represented as a W dimension, the W dimension is preferably more than or equal to 0.125 mm and less than or equal to 0.3 mm (i.e., from 0.125 mm to 0.3 mm). When the dimension in height direction x is represented as a T dimension, electronic component 14 preferably has a T dimension of more than or equal to 0.125 mm and less than or equal to 0.3 mm (i.e., from 0.125 mm to 0.3 mm).

(c) Electronic Component Package

As shown in FIG. 3, electronic component package 12 includes a base tape 20 having electronic components 14 disposed therein; and a cover tape 22 adhered to at least a large portion of the upper surface of base tape 20.

(d) Base Tape

Here, a direction (long side direction) in which base tape 20 extends in the form of a strip is defined as a length direction Z, and a short side direction is defined as a width direction Y. A direction orthogonal to length direction Z and width direction Y is defined as X. In length direction Z, a downstream direction indicated by an arrow F (hereinafter, also referred to as "conveyance direction F"), which is a tape conveyance direction of base tape 20 during mounting, is defined as a positive direction.

Base tape 20 according to the first embodiment serves to accommodate a plurality of electronic components 14 therein. Base tape 20 includes a tape main body 30 in the form of a strip.

Tape main body 30 has a pair of main surfaces 30a and 30b facing each other and extending in the length direction. Tape main body 30 is composed of paper mainly composed of wood pulp.

Tape main body 30 is provided with a plurality of accommodation recesses 32 formed to be separated from each other in length direction Z and serving as regions for accommodating electronic components 14 therein. Accommodation recesses 32 are provided continuously side by side in one line at predetermined intervals in length direction Z of tape main body 30. Accommodation recesses 32 are disposed only on one side of tape main body 30 in width direction Y.

Tape main body 30 is provided with feed holes 34 formed to be separated from each other and disposed side by side in one line in the length direction of tape main body 30. Feed holes 34 are disposed only on the other side of tape main body 30 in width direction Y. Feed holes 34 are to be engaged with the teeth of a sprocket (not shown) for drawing out electronic component series 10 from reel R.

Each of accommodation recesses 32 has a quadrangular opening portion 36 in one main surface 30a. Accommodation recess 32 is recessed from one main surface 30a toward the other main surface 30b of tape main body 30, and has a substantially rectangular parallelepiped shape. Accommodation recess 32 is sized to accommodate an electronic component 14.

More specifically, accommodation recess 32 is constituted of a bottom surface 38 and four side surfaces 40a, 40b, 40c, 40d. Side surface 40a and side surface 40b face each other in length direction Z. Side surface 40c and side surface 40d face each other in width direction Y.

In the present embodiment, bottom surface 38 is a placement portion 38a having a surface for placing an electronic component 14 thereon. Placement portion 38a is inclined to be deeper toward the downstream in the tape conveyance direction during mounting. The slope of placement portion 38a is represented by $\theta_1$. Slope $\theta_1$ of placement portion 38a is an angle formed between placement portion 38a and one main surface 30a of tape main body 30. Slope $\theta_1$ of placement portion 38a is more than 10° and less than or equal to 20° (i.e., from more than 10° to 20°).

(e) Cover Tape

After accommodating electronic components 14 in accommodation recesses 32 of base tape 20, cover tape 22 is adhered continuously onto one main surface 30a of tape main body 30 of base tape 20 so as to cover the upper end openings including opening portions 36 of the plurality of accommodation recesses 32. Cover tape 22 is disposed only on one side of tape main body 30 in width direction Y so as not to close feed holes 34.

Cover tape 22 is preferably transparent or translucent to externally check accommodation states of electronic components 14. Cover tape 22 may be one of a heat-sensitive type cover tape and a pressure-sensitive type cover tape.

Electronic component series 10 is configured such that electronic components 14 are lifted out from accommodation recesses 32 by peeling off cover tape 22 while conveying base tape 20 in one direction.

According to electronic component series 10 shown in FIGS. 3 to 5, placement portion 38a is inclined to be deeper toward the downstream in the tape conveyance direction during mounting, and slope $\theta_1$ of placement portion 38a is more than 10° and less than or equal to 20° (i.e., from more than 10° to 20°). Hence, electronic component 14 accommodated in accommodation recess 32 in base tape 20 composed of paper can be self-aligned in accommodation recess 32 at a position on the downstream side in the conveyance direction.

(f) First Modification of Electronic Component Series According to First Embodiment Next, an electronic component series according to a first modification of the first embodiment of the present disclosure will be described. The configuration of an electronic component series 10A according to the first modification is the same as the configuration of electronic component series 10 except that placement portion 38a is inclined also in width direction Y. Therefore, the same portions as those in electronic component series 10 are denoted by the same reference characters, and will not be described.

Figure 6:
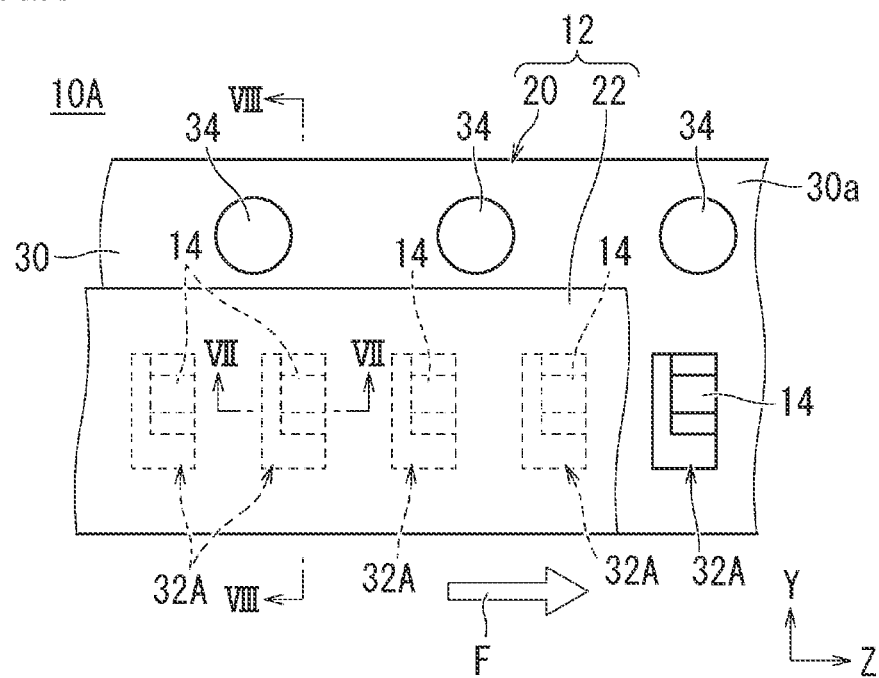
FIG. 6 is a top view showing an external appearance of an electronic component series according to a first modification of the first embodiment of the present disclosure.
Figure 7:
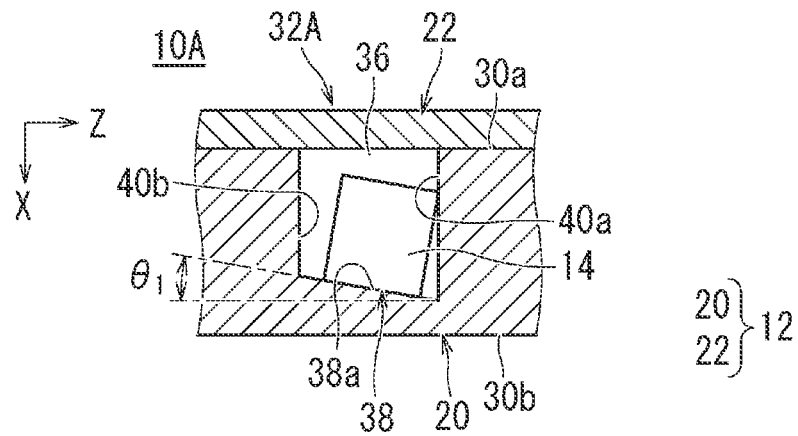
FIG. 7 is a cross sectional view taken along a line VII-VII in FIG. 6.
Figure 8:
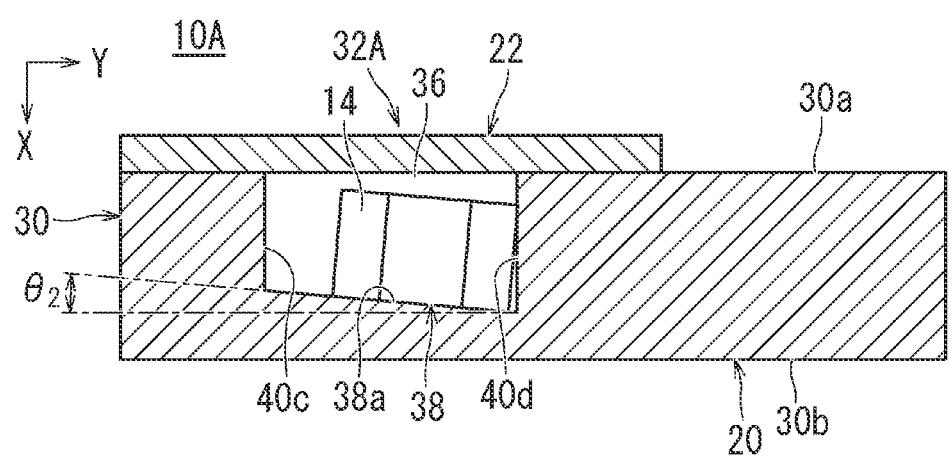
FIG. 8 is a cross sectional view taken along a line VIII-VIII in FIG. 6.

FIG. 6 is a top view showing an external appearance of the electronic component series according to the first modification of the first embodiment of the present disclosure. FIG. 7 is a cross sectional view taken along a line VII-VII in FIG. 6. FIG. 8 is a cross sectional view taken along a line VIII-VIII in FIG. 6.

Each of accommodation recesses 32A according to the first modification has a quadrangular opening portion 36 in one main surface 30a. Accommodation recess 32 is recessed from one main surface 30a toward the other main surface 30b of tape main body 30, and has a substantially rectangular parallelepiped shape. Accommodation recess 32 is sized to accommodate an electronic component 14.

More specifically, accommodation recess 32A is constituted of a bottom surface 38 and four side surfaces 40a, 40b, 40c, 40d. Side surface 40a and side surface 40b face each other in length direction Z. Side surface 40c and side surface 40d face each other in width direction Y.

In the first modification of the present embodiment, bottom surface 38 is a placement portion 38a for placing electronic component 14. Placement portion 38a is inclined to be deeper toward the downstream in the tape conveyance direction during mounting. The first slope of placement portion 38a is represented by $\theta_1$. Slope $\theta_1$ of placement portion 38a is an angle between placement portion 38a and one main surface 30a of tape main body 30 in length direction Z. Slope $\theta_1$ of placement portion 38a is more than 10° and less than or equal to 20° (i.e., from more than 10° to 20°).

Further, placement portion 38a is also inclined in width direction Y, which is the short side direction of tape main body 30. That is, placement portion 38a is inclined to be deeper from one side toward the other side of tape main body 30. The second slope of placement portion 38a is represented by $\theta_2$. Slope $\theta_2$ of placement portion 38a is an angle between placement portion 38a and one main surface 30a of tape main body 30 in width direction Y. Second slope $\theta_2$ of placement portion 38a is preferably more than 10° and less than or equal to 20° (i.e., from more than 10° to) 20°.

Electronic component series 10A according to the first modification of the first embodiment shown in FIGS. 6 to 8 exhibits the following effect in addition to the same effects as those of electronic component series 10 according to the first embodiment.

That is, in electronic component series 10A shown in FIGS. 6 to 8, since placement portion 38a is further inclined to be deeper from one side toward the other side of tape main body 30, electronic component 14 accommodated in accommodation recess 32A can be also self-aligned in accommodation recess 32A at a position in width direction Y of tape main body 30.

(g) Second Modification of Electronic Component Series According to First Embodiment Next, an electronic component series according to a second modification of the first embodiment of the present disclosure will be described. The configuration of an electronic component series 10B according to the second modification is the same as that of electronic component series 10 except that a cutout portion is further provided in accommodation recess 32B. Therefore, the same portions as those of electronic component series 10 are denoted by the same reference characters, and will not be described.

Figure 9:
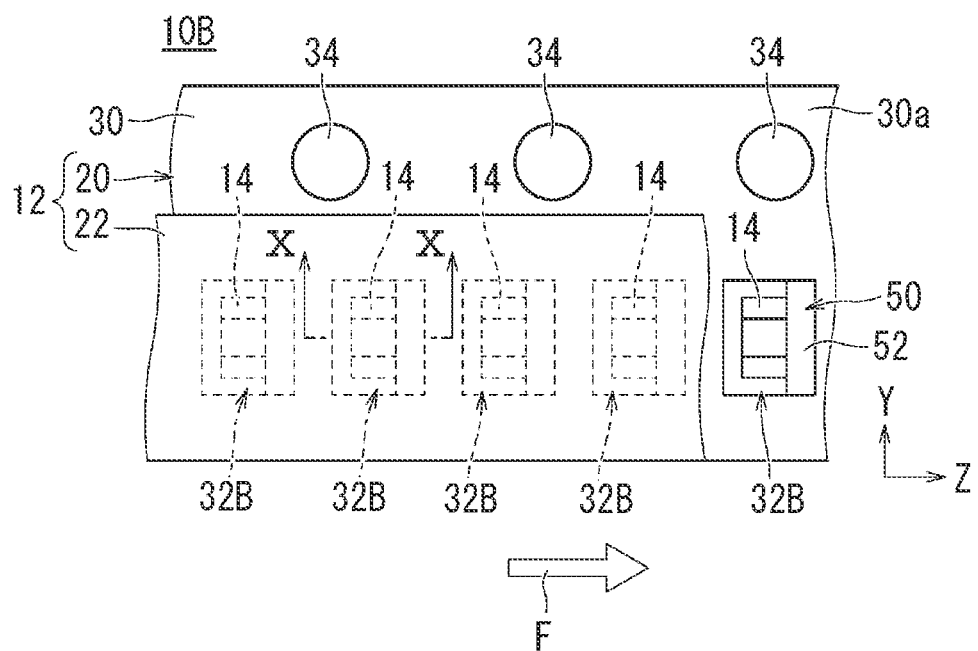
FIG. 9 is a top view showing an external appearance of an electronic component series according to a second modification of the first embodiment of the present disclosure.
Figure 10:
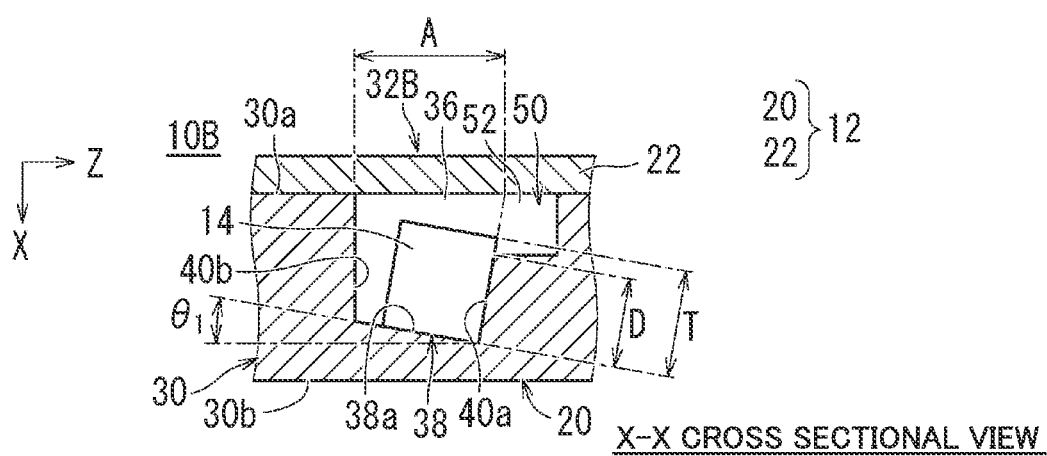
FIG. 10 is a cross sectional view taken along a line X-X in FIG. 9.

FIG. 9 is a top view showing an external appearance of the electronic component series according to the second modification of the first embodiment of the present disclosure. FIG. 10 is a cross sectional view taken along a line X-X in FIG. 9.

Each of accommodation recesses 32B according to the second modification has a quadrangular opening portion 36 in one main surface 30a. Accommodation recess 32 is recessed from one main surface 30a toward the other main surface 30b of tape main body 30, and has a substantially rectangular parallelepiped shape. Accommodation recess 32 is sized to accommodate an electronic component 14.

More specifically, accommodation recess 32B is constituted of bottom surface 38 and four side surfaces 40a, 40b, 40c, 40d. Side surface 40a and side surface 40b face each other in length direction Z. Side surface 40c and side surface 40d face each other in width direction Y.

In the second modification according to the present embodiment, bottom surface 38 is a placement portion 38a for placing electronic component 14. Placement portion 38a is inclined to be deeper toward the downstream in the tape conveyance direction (direction of arrow F) during mounting. The first slope of placement portion 38a is represented by $\theta_1$. Slope $\theta_1$ of placement portion 38a is an angle between placement portion 38a and one main surface 30a of tape main body 30 in length direction Z. Slope $\theta_1$ of placement portion 38a is more than 10° and less than or equal to 20° (i.e., from more than 10° to 20°).

Further, placement portion 38a may be also inclined in width direction Y of tape main body 30. The second slope of placement portion 38a is represented by $\theta_2$. Slope $\theta_1$ of placement portion 38a is an angle between placement portion 38a and one main surface 30a of tape main body 30 in width direction Y. Second slope $\theta_2$ of placement portion 38a is preferably more than 10° and less than or equal to 20° (i.e., from more than 10° to 20°).

In accommodation recess 32B, a substantially right angle is formed between side surface 40a located on the downstream side in conveyance direction F and the surface of placement portion 38a.

A cutout portion 50 is provided to be continuous to side surface 40a of accommodation recess 32B on downstream side in the tape conveyance direction. Cutout portion 50 is recessed from one main surface 30a of tape main body 30 toward other main surface 30b. Cutout portion 50 has a quadrangular auxiliary opening portion 52 in one main surface 30a of tape main body 30 when viewed from the Y-Z plane.

By providing cutout portion 50, a length D from a lowermost point to an uppermost point of side surface 40a of accommodation recess 32B located on the downstream side in contact with electronic component 14 in a direction along side surface 40a located on the downstream side is smaller than dimension T of electronic component 14 in the height direction.

Figure 11:
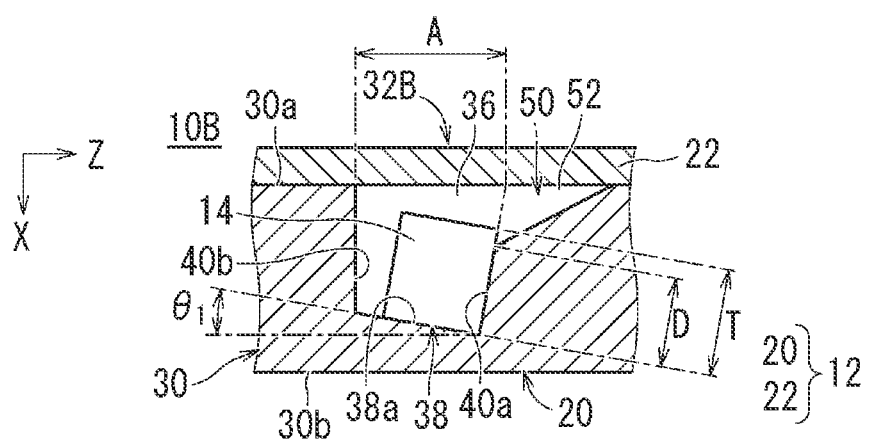
FIG. 11 is a diagram corresponding to FIG. 10 according to another example of the second modification of the first embodiment of the present disclosure.

It should be noted that cutout portion 50 may be formed by a structure as shown in FIG. 11.

That is, cutout portion 50 may be configured to decrease in height toward side surface 40a on one side in length direction Z among the four sides of opening portion 36 of accommodation recess 32B and decrease in height in a direction from one main surface 30a of tape main body 30 toward the inner side of the accommodation recess 32B (direction toward bottom surface 38). That is, cutout portion 50 may be configured to increase in depth toward side surface 40a on one side in length direction Z among the four sides of opening portion 36 of accommodation recess 32B and may be configured to be continuous to side surface 40a of accommodation recess 32B.

Also in the case of the structure of cutout portion 50 shown in FIG. 11, by providing cutout portion 50, a length D from a lowermost point to an uppermost point of side surface 40a of accommodation recess 32B located on the downstream in contact with electronic component 14 in the direction along side surface 40a located on the downstream side is smaller than dimension T of electronic component 14 in the height direction.

It should be noted that the cross sectional shape of cutout portion 50 when viewed from width direction Y may be any one of a quadrangular shape, an inclined surface shape, a protruding curved surface shape, and a recessed curved surface shape.

Electronic component series 10B according to the second modification of the first embodiment shown in FIGS. 9 and 10 exhibits the following effect in addition to the same effects as those of electronic component series 10 according to the first embodiment.

That is, in electronic component series 10A according to the first modification of the first embodiment, since placement portion 38a is also inclined toward the downstream in the conveyance direction of tape main body 30, electronic component 14 accommodated in accommodation recess 32 can be self-aligned at the downstream end in the conveyance direction.

Figure 12:
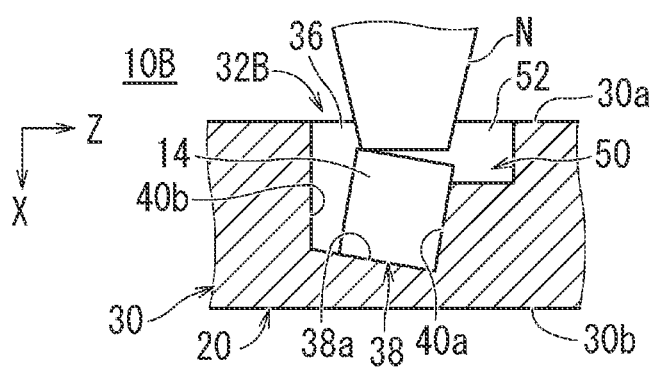
FIG. 12 is an explanatory view showing a state in which an electronic component is suctioned by a pickup nozzle.

As shown in FIG. 12, when suctioning electronic component 14 using a pickup nozzle N such that the center of pickup nozzle N coincides with the center of electronic component 14, auxiliary opening portion 52 of cutout portion 50 allows pickup nozzle N to suction electronic component 14 with the tip of pickup nozzle N being avoided from interfering with one main surface 30a of tape main body 30.

2. Second Embodiment

Next, an electronic component series according to a second embodiment will be described.

(a) Electronic Component Series

Figure 13:
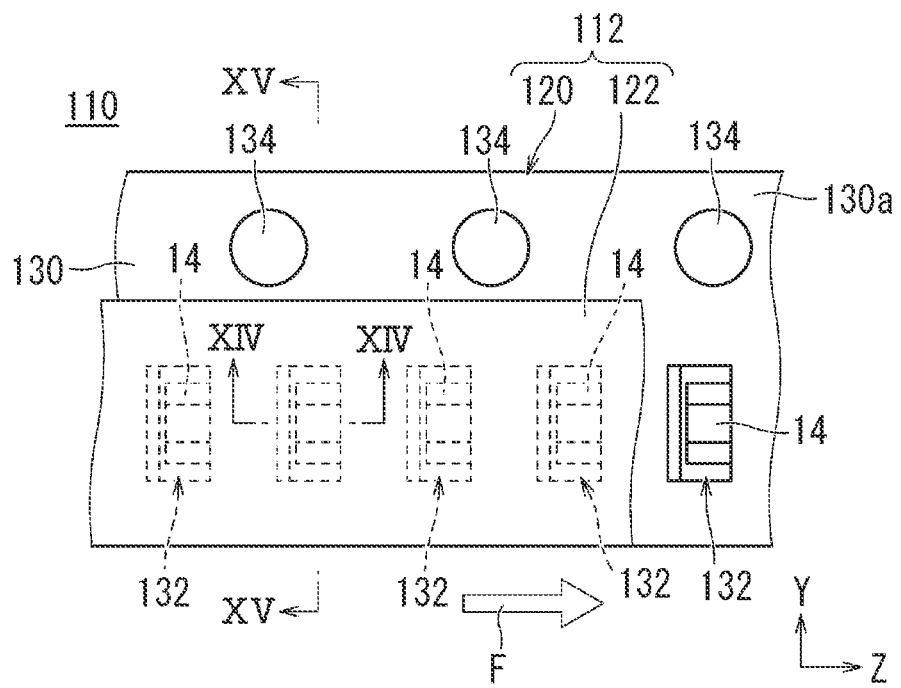
FIG. 13 is a top view showing an external appearance of an electronic component series according to a second embodiment of the present disclosure.
Figure 14:
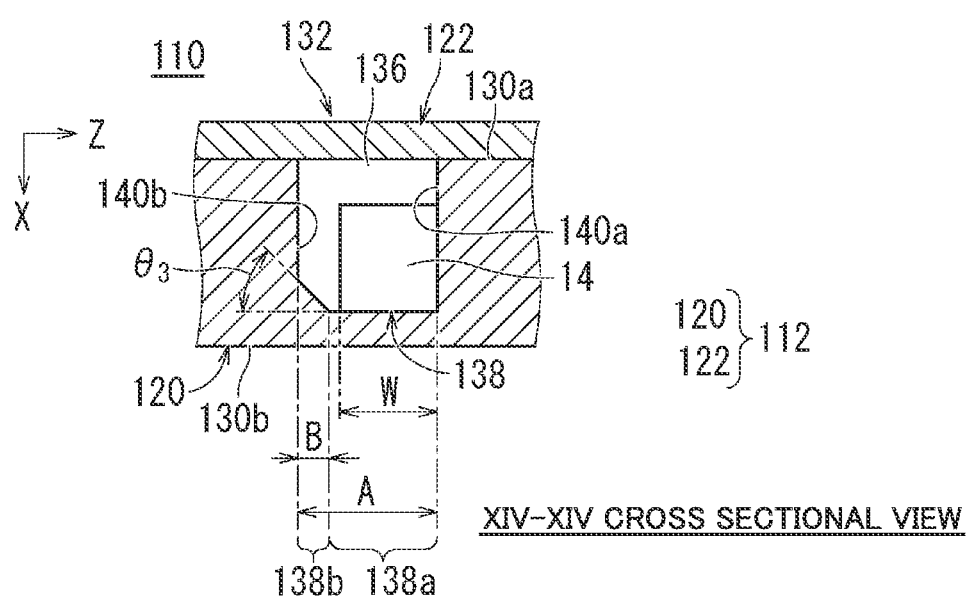
FIG. 14 is a cross sectional view taken along a line XIV-XIV in FIG. 13.
Figure 15:
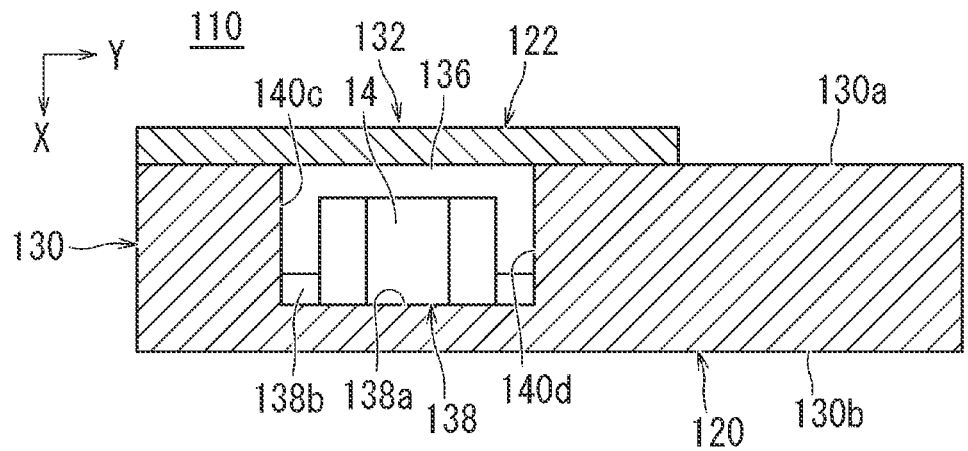
FIG. 15 is a cross sectional view taken along a line XV-XV in FIG. 13.

FIG. 13 is a top view showing an external appearance of the electronic component series according to the second embodiment of the present disclosure. FIG. 14 is a cross sectional view taken along a line XIV-XIV in FIG. 13. FIG. 15 is a cross sectional view taken along a line XV-XV in FIG. 13.

As shown in FIG. 13, electronic component series 110 of the second embodiment includes an electronic component package 112 and electronic components 14. As shown in FIG. 2, electronic component series 110 is wound around a reel R.

(b) Electronic Component

Electronic components 14 included in electronic component series 110 according to the second embodiment are the same as electronic components 14 included in electronic component series 10 according to the first embodiment, and will not be therefore described.

(c) Electronic Component Package

As shown in FIG. 13, electronic component package 112 includes a base tape 120 having electronic components 14 disposed therein; and a cover tape 122 adhered to at least a large portion of the upper surface of base tape 120.

(d) Base Tape

Here, a direction (long side direction) in which base tape 120 extends in the form of a strip is defined as a length direction Z, and a short side direction is defined as a width direction Y. A direction orthogonal to length direction Z and width direction Y is defined as X. In length direction Z, a downstream direction indicated by an arrow F (hereinafter, also referred to as "conveyance direction F"), which is a tape conveyance direction of base tape 120 during mounting, is defined as a positive direction.

Base tape 120 according to the second embodiment serves to accommodate a plurality of electronic components 14 therein. Base tape 120 includes a tape main body 130 in the form of a strip.

Tape main body 130 has a pair of main surfaces 130a and 130b facing each other and extending in the length direction. Tape main body 130 is composed of paper mainly composed of wood pulp.

It should be noted that the material of tape main body 130 may be, for example, a synthetic resin, i.e., polystyrene, polycarbonate, polyethylene terephthalate, polypropylene, or the like. An embossing method is not particularly limited, and air pressure molding, press molding, vacuum rotary molding (vacuum drum molding), or the like is appropriately employed, for example. By forming tape main body 130 using such a material, accommodation recess 132 can be readily formed and an operation in a clean room can be performed.

Tape main body 130 is provided with a plurality of accommodation recesses 132 formed to be separated from each other in length direction Z and serving as regions for accommodating electronic components 14 therein. Accommodation recesses 132 are provided continuously side by side in one line at predetermined intervals in length direction Z of tape main body 130. Accommodation recesses 132 are disposed only on one side of tape main body 130 in width direction Y.

Tape main body 130 is provided with feed holes 134 formed to be separated from each other and disposed side by side in one line in the length direction thereof. Feed holes 134 are disposed only on the other side of tape main body 130 in width direction Y. Feed holes 134 are to be engaged with the teeth of a sprocket (not shown) for drawing out electronic component series 110 from reel R.

Each of accommodation recesses 132 has a quadrangular opening portion 136 in one main surface 130a. Accommodation recess 132 is recessed from one main surface 130a toward other main surface 130b of tape main body 130, and has a substantially rectangular parallelepiped shape. Accommodation recess 132 is sized to accommodate an electronic component 14.

More specifically, accommodation recess 132 is constituted of a bottom surface 138 and four side surfaces 140a, 140b, 140c, 140d. First side surface 140a and second side surface 140b face each other in length direction Z. First side surface 140a is located on the downstream side in conveyance direction F, and second side surface 140b is located on the upstream side in conveyance direction F. Side surface 140c and side surface 140d face each other in width direction Y. Third side surface 140c is located on one side in width direction Y, and fourth side surface 140d is located on the other side in width direction Y.

In the present embodiment, bottom surface 138 has: a placement portion 138a having a surface for placing electronic component 14; and a guiding portion 138b, provided between second side surface 140b and placement portion 138a, for guiding electronic component 14 to placement portion 138a.

The surface of placement portion 138a is substantially parallel to one main surface 130a of tape main body 130, and inclination angle $\theta_3$ of guiding portion 138b with respect to the surface of placement portion 138a is more than or equal to 30° and less than or equal to 80° (i.e., from 30° to 80°).

It should be noted that guiding portion 138b may be provided between first side surface 140a and placement portion 138a.

Figure 16:
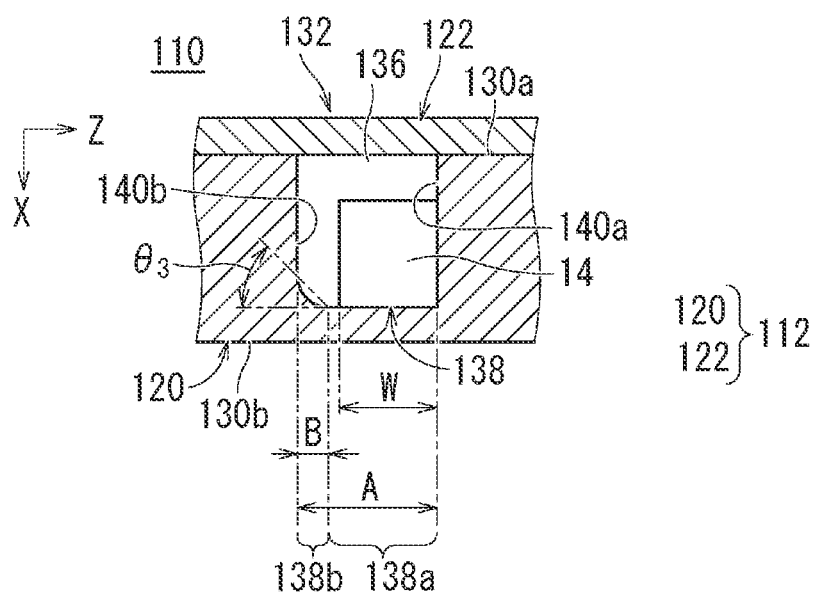
FIG. 16 is a diagram corresponding to FIG. 14 according to another example of the second embodiment of the present disclosure.

It should be noted that guiding portion 138b may be formed in the form of a curved surface as shown in FIG. 16. In this case, $\theta_3$ represents an angle formed between main surface 130a and a line that connects between the end portions of the curved surface. The angle is more than or equal to 30° and less than or equal to 80° (i.e., from 30° to 80°).

Dimension B of guiding portion 138b in the conveyance direction is preferably determined as follows. That is, when the length of opening portion 136 of accommodation recess 132 in the conveyance direction is represented by A, it is preferable to satisfy a condition of 0.7×(A-W)≤B≤0.9×(A-W) in view of a relation with the W dimension of electronic component 14. Thus, electronic component 14 can be stably disposed on placement portion 138a.

(e) Cover Tape

After accommodating electronic components 14 in accommodation recesses 132 of base tape 120, cover tape 122 is adhered continuously onto one main surface 130a of tape main body 130 of base tape 120 so as to cover the upper end openings including opening portions 136 of the plurality of accommodation recesses 132. Cover tape 122 is disposed only on one side of tape main body 130 in width direction Y so as not to close feed holes 134.

Cover tape 122 is preferably transparent or translucent to externally check accommodation states of electronic components 14. Cover tape 122 may be one of a heat-sensitive type cover tape and a pressure-sensitive type cover tape.

Electronic component series 110 is configured such that electronic components 14 are lifted out from accommodation recesses 132 by peeling off cover tape 122 while conveying base tape 120 in one direction.

According to electronic component series 110 shown in FIG. 13, bottom surface 138 has: placement portion 138a having a surface for placing electronic component 14; and guiding portion 138b, provided between second side surface 140b and placement portion 138a, for guiding electronic component 14 to placement portion 138a. The surface of placement portion 138a is substantially parallel to one main surface 130a of tape main body 130. Guiding portion 138b thus included is an inclined surface inclined by more than or equal to 30° with respect to the surface of placement portion 138a. Hence, the main surface of electronic component 14 can be maintained to be horizontal without changing the width of each opening portion 136. Accordingly, electronic component 14 can be suctioned more stably by a pickup nozzle. Moreover, since electronic component 14 accommodated in accommodation recess 132 can be self-aligned in accommodation recess 132 at a predetermined position in length direction Z of tape main body 130, the risk of interference between a previously mounted electronic component and the nozzle during mounting can be reduced.

(f) First Modification of Electronic Component Series According to Second Embodiment Next, an electronic component series according to a first modification of the second embodiment of the present disclosure will be described. The configuration of an electronic component series 110A according to the first modification is the same as that of electronic component series 110 except that a guiding portion is also provided in width direction Y in accommodation recess 138. Therefore, the same portions as those of electronic component series 110 are denoted by the same reference characters, and will not be described.

Figure 17:
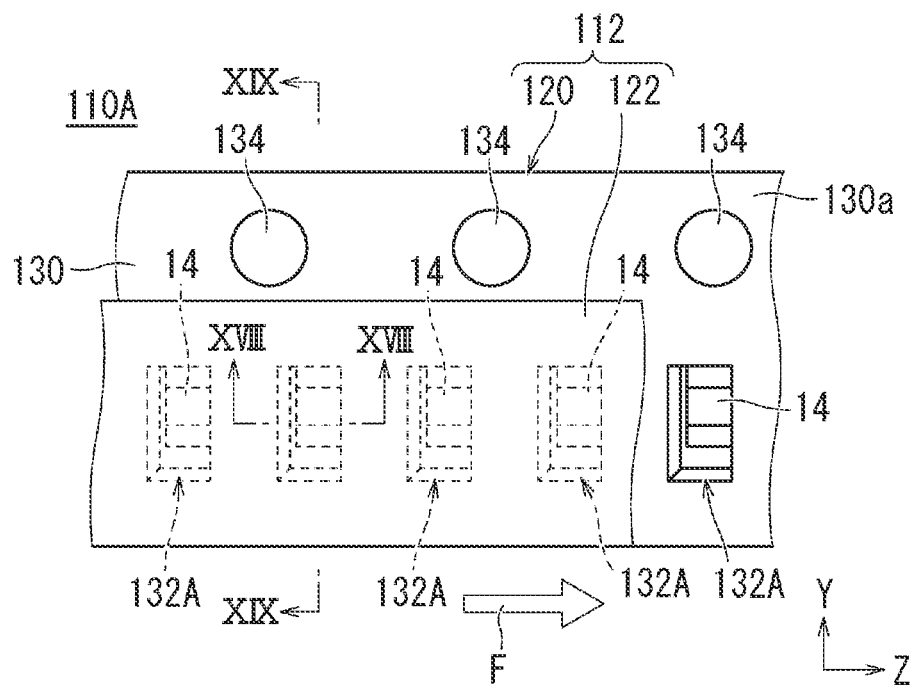
FIG. 17 is a top view showing an external appearance of an electronic component series according to a first modification of the second embodiment of the present disclosure.
Figure 18:
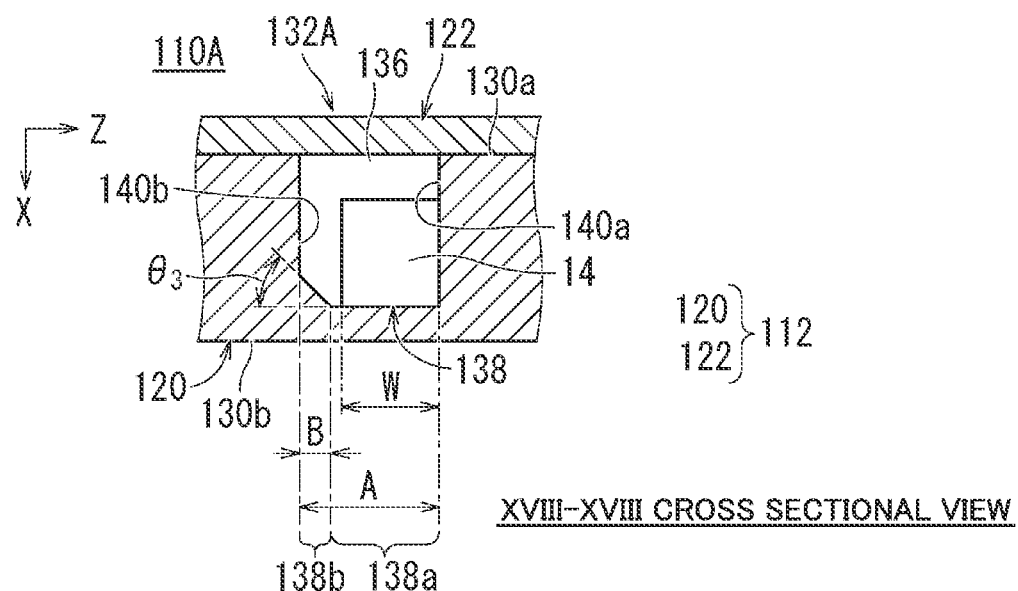
FIG. 18 is a cross sectional view taken along a line XVIII-XVIII in FIG. 17.
Figure 19:
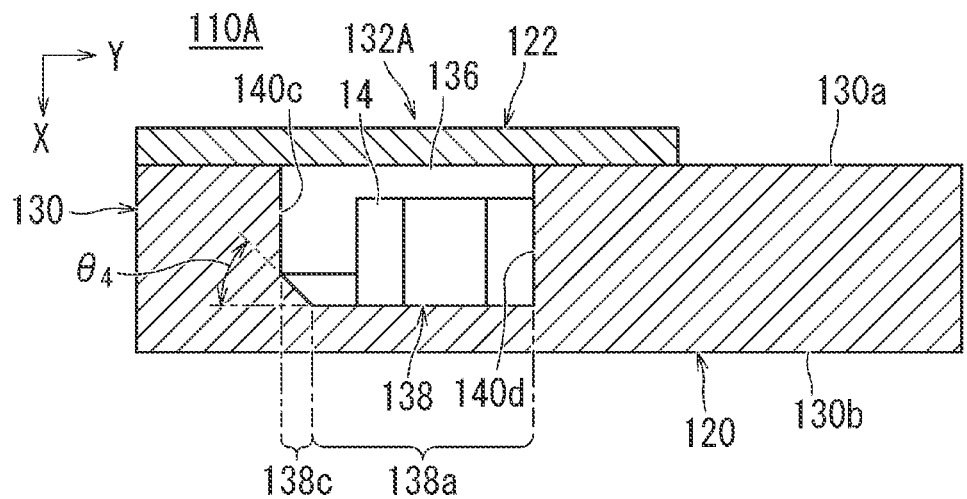
FIG. 19 is a cross sectional view taken along a line XIX-XIX in FIG. 17.

FIG. 17 is a top view showing an external appearance of the electronic component series according to the first modification of the second embodiment of the present disclosure. FIG. 18 is a cross sectional view taken along a line XVIII-XVIII in FIG. 17. FIG. 19 is a cross sectional view taken along a line XIX-XIX in FIG. 17.

In the first modification of the present embodiment, bottom surface 138 of accommodation recess 132A has: a placement portion 138a having a surface for placing electronic component 14; and a guiding portion 138b, provided between second side surface 140b and placement portion 138a, for guiding electronic component 14 to placement portion 138a.

The surface of placement portion 138a is substantially parallel to one main surface 130a of tape main body 130, and inclination angle $\theta_3$ of guiding portion 138b with respect to the surface of placement portion 138a is more than or equal to 30° and less than or equal to 80° (i.e., from 30° to 80°).

Further, in bottom surface 138 of accommodation recess 132A, a guiding portion 138c is provided on at least one of one side and the other side in width direction Y, which is the short side direction of base tape 120.

The surface of placement portion 138a is substantially parallel to one main surface 130a of tape main body 130, and inclination angle $\theta_4$ of guiding portion 138c with respect to the surface of placement portion 138a is more than or equal to 30° and less than or equal to 80° (i.e., from 30° to 80°).

Electronic component series 110A according to the first modification of the second embodiment shown in FIGS. 17 to 19 exhibits the following effect in addition to the same effects as those of electronic component series 110 according to the second embodiment.

That is, in electronic component series 110A shown in FIGS. 17 to 19, guiding portion 138c is provided in bottom surface 138 on at least one of one side and the other side in width direction Y, which is the short side direction of base tape 120. Hence, electronic component 14 accommodated in accommodation recess 132A can be also self-aligned in accommodation recess 132A at a predetermined position in width direction Y of tape main body 130.

(g) Second Modification of Electronic Component Series According to Second Embodiment Next, an electronic component series according to a second modification of the second embodiment of the present disclosure will be described. The configuration of electronic component series 110B according to the second modification is the same as that of electronic component series 110 except that a cutout portion is further provided in accommodation recess 132B. Therefore, the same portions as those of electronic component series 110 are denoted by same reference characters, and will not be described.

Figure 20:
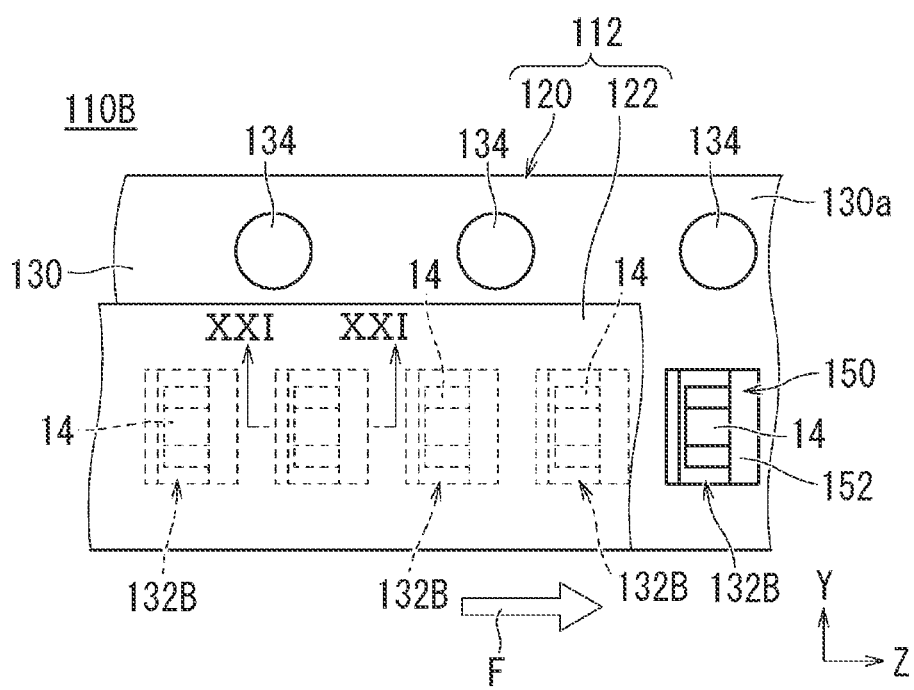
FIG. 20 is a top view showing an external appearance of an electronic component series according to a second modification of the second embodiment of the present disclosure.
Figure 21:
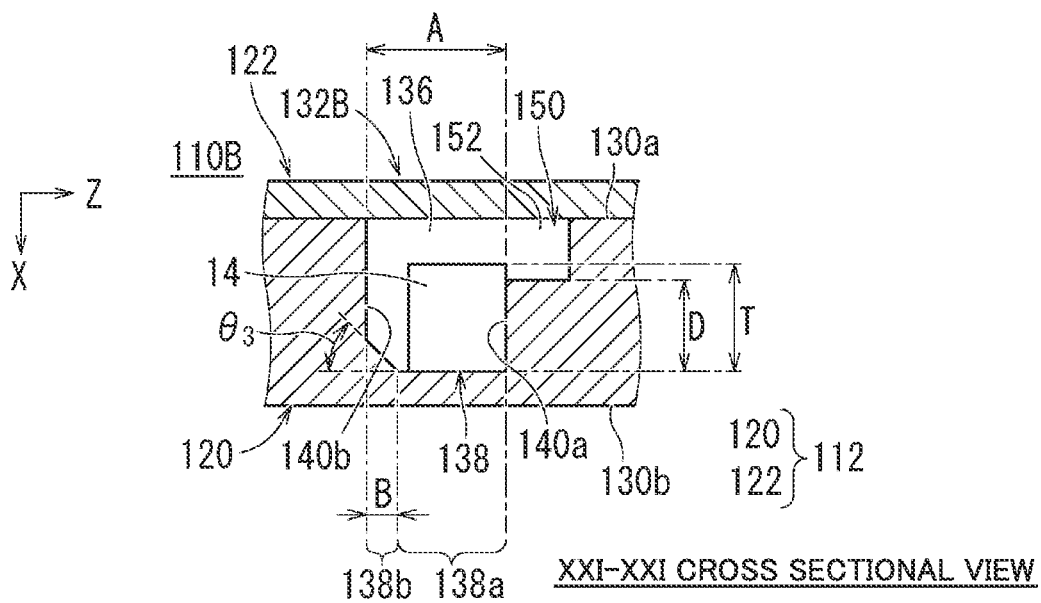
FIG. 21 is a cross sectional view taken along a line XXI-XXI in FIG. 20.

FIG. 20 is a top view showing an external appearance of the electronic component series according to the second modification of the second embodiment of the present disclosure. FIG. 21 is a cross sectional view taken along a line XXI-XXI in FIG. 20.

A cutout portion 150 is provided to be continuous to side surface 140a of accommodation recess 132B on the downstream side in the tape conveyance direction. Cutout portion 150 is recessed from one main surface 130a of tape main body 130 toward other main surface 130b. Cutout portion 150 has a quadrangular auxiliary opening portion 152 in one main surface 130a of tape main body 130 when viewed from the Y-Z plane.

By providing cutout portion 150, a length D from a lowermost point to an uppermost point of first side surface 140a of accommodation recess 132B located on the downstream side in contact with electronic component 14 in a direction along first side surface 140a located on the downstream side is smaller than dimension T of electronic component 14 in the height direction.

Figure 22:
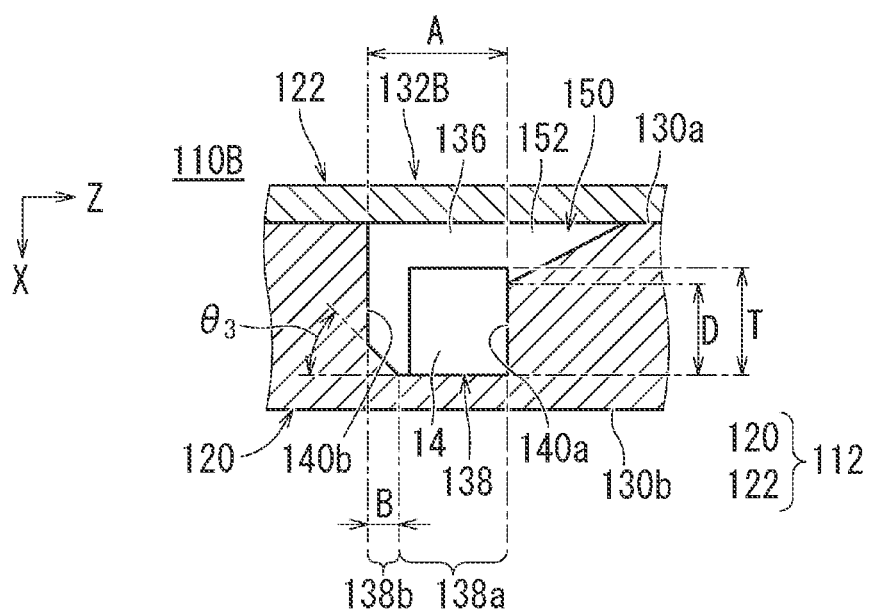
FIG. 22 is a diagram corresponding to FIG. 21 according to another example of the second modification of the second embodiment of the present disclosure.

It should be noted that cutout portion 150 may be formed by a structure as shown in FIG. 22.

That is, cutout portion 150 may be configured to decrease in height toward first side surface 140a on one side in length direction Z among the four sides of opening 140a of accommodation recess 132B and decrease in height in a direction from one main surface 130a of tape main body 130 toward the inner side of accommodation recess 132B (direction toward bottom surface 138a). That is, cutout portion 150 may be configured to increase in depth toward side surface 140a on one side in length direction Z among the four sides of opening portion 136 of accommodation recess 132B and may be configured to be continuous to first side surface 140a of accommodation recess 132B.

Also in the case of the structure of cutout portion 150 shown in FIG. 22, by providing cutout portion 150, a length D from a lowermost point to an uppermost point of first side surface 140a of accommodation recess 132B located on the downstream side in contact with electronic component 14 in the direction along first side surface 140a located on the downstream side is smaller than dimension T of electronic component 14 in the height direction.

It should be noted that the cross sectional shape of cutout portion 150 when viewed from width direction Y may be any one of a quadrangular shape, an inclined surface shape, a protruding curved surface shape, and a recessed curved surface shape.

Electronic component series 110B according to the second modification of the second embodiment shown in FIGS. 20 and 21 exhibits the following effect in addition to the same effects as those of electronic component series 110 according to the second embodiment.

That is, since cutout portion 150 is further provided in base tape 120, the base tape and the nozzle do not interfere with each other when suctioning electronic component 14 such that the center of the suction hole of pickup nozzle N coincides with the center of electronic component 14.

(h) Third Modification of Electronic Component Series According to Second Embodiment Next, an electronic component series according to a third modification of the second embodiment of the present disclosure will be described. The configuration of an electronic component series 110C according to the third modification is the same as that of electronic component series 110 except that a plurality of guiding portions are provided in bottom surface 138. Therefore, the same portions as those of electronic component series 110 are denoted by the same reference characters, and will not be described.

Figure 23:
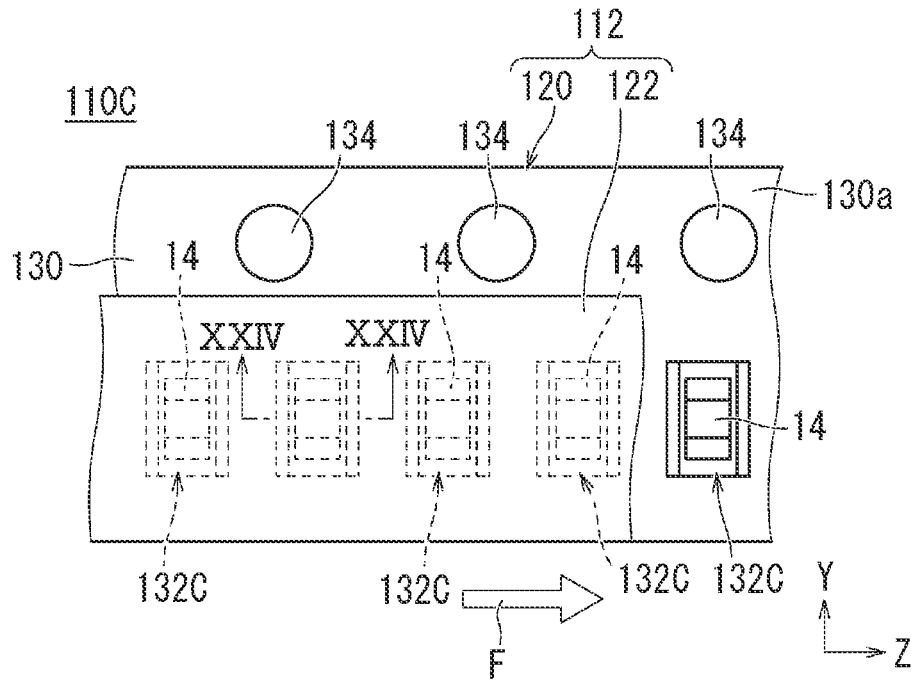
FIG. 23 is a top view showing an external appearance of an electronic component series according to a third modification of the second embodiment of the present disclosure.
Figure 24:
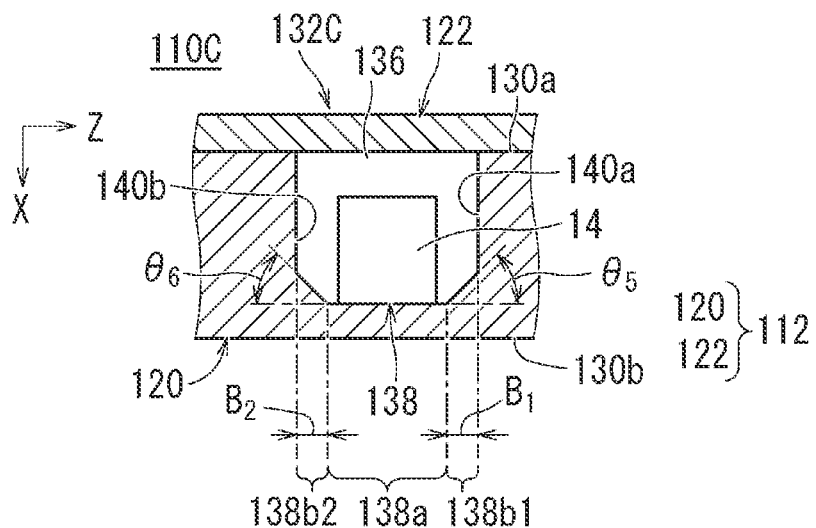
FIG. 24 is a cross sectional view taken along a line XXIV-XXIV in FIG. 22.

FIG. 23 is a top view showing an external appearance of the electronic component series according to the third modification of the second embodiment of the present disclosure. FIG. 24 is a cross sectional view taken along a line XXIV-XXIV in FIG. 23.

A first guiding portion 138b1 is provided between first side surface 140a and placement portion 138a, and a second guiding portion 138b2 is provided between second side surface 140b and placement portion 138a.

Width $B_1$ of first guiding portion 138b1 in conveyance direction F is equal to or more than 70% and equal to or less than 90% (i.e., from 70% to 90%) of a distance between the downstream end of the electronic component and the first side surface.

Width $B_2$ of second guiding portion 138b2 in conveyance direction F is equal to or more than 70% and equal to or less than 90% (i.e., from 70% to 90%) of a distance between the upstream end of the electronic component and the second side surface.

The surface of placement portion 138a is substantially parallel to one main surface 130a of tape main body 130, and inclination angle $\theta_5$ of first guiding portion 138b1 with respect to the surface of placement portion 138a is more than or equal to 30° and less than or equal to 80° (i.e., from 30° to 80°), and inclination angle $\theta_6$ of second guiding portion 138b2 with respect to the surface of placement portion 138a is more than or equal to 30° and less than or equal to 80° (i.e., from 30° to 80°).

It should be noted that each of the shapes of first guiding portion 138b1 and second guiding portion 138b2 is not limited to an inclined surface shape, and may be a curved surface shape.

Guiding portion 138b1 may be provided between third side surface 140c and placement portion 138a and guiding portion 138b2 may be provided between fourth side surface 140d and placement portion 138a in the width direction.

Thus, the guiding portions can be provided for the directions for which precision is required.

The guiding portions may be provided between bottom surface 138 and each of four side surfaces 140a to 140d.

Thus, electronic component 14 can be disposed in the vicinity of the center of bottom surface 138 of accommodation recess 132.

Electronic component series 110C according to the third modification of the second embodiment shown in FIGS. 22 and 23 exhibits the following effect in addition to the same effects as those of electronic component series 110 according to the second embodiment.

That is, since first guiding portion 138b1 is provided between first side surface 140a and placement portion 138a and second guiding portion 138b2 is provided between second side surface 140b and placement portion 138a, electronic component 14 can be disposed at the middle position inside accommodation recess 132, with the result that interference between the pickup nozzle and one main surface 130a of tape main body 130 can be avoided without additionally providing a cutout portion.

3. Method for Manufacturing Electronic Component Series

Next, a method for manufacturing an electronic component series will be described.

First, a method for manufacturing a base tape will be described.

As a base material for manufacturing the base tape, paper, a synthetic resin, or the like can be used, for example.

In the case where the base material is paper, the base tape may be manufactured as a punched carrier tape provided with accommodation recesses by removing portions of the base material by a punching process and then attaching a bottom tape to the backside surface of the base material. Alternatively, the base tape may be manufactured as a press carrier tape provided with accommodation recesses by performing a compressing process (pressing process) onto portions of the base material.

When the base material is a synthetic resin, the base tape may be manufactured as an embossed carrier tape provided with accommodation recesses by embossing portions of the base material into recessed shapes.

For the base tape included in the electronic component series according to the present disclosure, any of the above-described base tapes may be used; however, the base tape obtained through the embossing or pressing process is preferably used because it is necessary to incline the placement portion or form the placement portion and the guiding portion(s) in the bottom surface of each accommodation recess.

Then, a mounting device is used to appropriately accommodate electronic components in the accommodation recesses of the base tape, and then the openings of the accommodation recesses are covered with a cover tape for the purpose of sealing, thereby manufacturing the electronic component series.

4. Exemplary Experiments

The following describes exemplary experiments performed by the inventors in order to confirm the effects of the present disclosure. It should be noted that a base tape used in each of the exemplary experiments is constituted of a multilayer paperboard having five or six layers. Each of electronic components to be accommodated was a 0402 chip with L dimension of 0.4 mm×W dimension of 0.2 mm×T dimension of 0.2 mm Each of accommodation recesses had a margin of 15% with 0.23 mm in the W dimension direction and 0.46 mm in the L dimension direction. The base tape was formed by a pressing process.

(a) Exemplary Experiment 1

In an exemplary experiment 1, an experiment was performed to evaluate a ratio of occurrence of a pickup failure by a pickup nozzle N when the inclination angle of the placement portion was changed between 0° and 30°. Specifications of examples and comparative examples are as follows.

Unlike in FIG. 7, a right angle was formed between the placement portion and the side surface on the downstream side.

Results thereof are shown in Table 1.

TABLE 1

| Sample No. | Inclination Angle (°) | Ratio of Occurrence of Pickup Failure (%) | Main Factor |
|---|---|---|---|
| 1 | 0 | 0.1 | Displacement from Nozzle |
| 2 | 5 | 0.1 | Displacement from Nozzle |
| 3 | 10 | 0.1 | Displacement from Nozzle |
| 4 | 11 | 0.05 | — |
| 5 | 15 | 0.05 | — |
| 6 | 20 | 0.05 | — |
| 7 | 25 | 0.5 | Suction Failure |
| 8 | 30 | 0.5 | Suction Failure |

According to Table 1, in each of samples No. 1 to No. 3, the inclination angle of the placement portion was less than or equal to 10°. Accordingly, the electronic component was not self-aligned because the electronic component did not slide due to such an inclination angle. Hence, a deviation was caused between the nozzle and the electronic component, thus resulting in occurrence of a pickup failure of 0.1%.

Meanwhile, in samples No. 7 and No. 8, the inclination angles of the placement portions was relatively large, i.e., 25° and 30°. Hence, the angle of each electronic component with respect to the suction hole of the pickup nozzle was also increased to cause a suction failure, thus resulting in occurrence of a pickup failure of 0.5%.

On the other hand, in each of samples No. 4 to No. 6, the inclination angle of the placement portion was more than 10° and less than or equal to 20° (i.e., from more than 10° to 20°). Hence, the electronic component was self-aligned to come into contact with the side surface of the accommodation recess on the downstream side. Further, no suction failure occurred between the suction hole of the pickup nozzle and the electronic component, thereby suppressing the pickup failure to a very low occurrence ratio of 0.05%.

(b) Exemplary Experiment 2

In an exemplary experiment 2, an experiment was performed to confirm the effects of electronic component series 110 according to the second embodiment.

As a comparative example, there was employed an electronic component series having a base tape provided with accommodation recesses in each of which no guiding portion was provided and no cutout portion was provided in an opening portion thereof. The length of the opening portion in length direction Z was 0.23 mm. The W dimension of the electronic component used was 0.20 mm Therefore, the margin is 0.03 mm.

As an example, there was employed a base tape having the structure with the accommodation recesses as shown in FIG. 22. That is, a guiding portion is provided in each accommodation recess of the base tape and a cutout portion is also provided in an opening portion thereof.

The size of B was 0.025 mm, and the angle of the inclined surface was 70° with respect to one main surface of the tape main body. That is, the size of B was 83% of the margin of 0.03 mm.

When a deviation between the center of the electronic component and the center of the suction hole of the pickup nozzle is more than or equal to 0.1 mm, it is normally determined that a pickup failure has occurred.

When the base tape according to the comparative example was used, the ratio of occurrence of pickup failure was 0.1%, whereas when the base tape according to the example was used, the ratio of occurrence of pickup failure could be suppressed to 0.05%.

Further, the electronic components were mounted in a high density on a mounting substrate at an interval of 60 μm between the electronic components.

As a result, when the base tape according to the comparative example was used, a ratio of occurrence of interference error between the pickup nozzle and an electronic component having been already mounted on the mounting substrate was 0.05%, whereas when the base tape according to the example was used, the ratio of occurrence of interference error with an electronic component having been already mounted on the mounting substrate could be suppressed to 0.001%.

In view of the above-described experiment results, it was recognized that in the electronic component series including the base tape according to the present disclosure, the electronic components can be stably picked up by the pickup nozzle. Further, even when mounting the electronic components on the mounting substrate in a high density at an interval of 60 μm between the electronic components, interference can be suppressed between the pickup nozzle and an electronic component having been already mounted on the mounting substrate.

As described above, the embodiments of the present disclosure are disclosed in the above description; however, the present disclosure is not limited thereto.

Various modifications can be made to the above-described embodiments with regard to mechanisms, shapes, materials, quantities, positions, arrangements, or the like without departing from the scope of the technical idea and object of the present disclosure, and are included in the present disclosure.

What is claimed is:

1. An electronic component series comprising:
a base tape provided with a multiplicity of accommodation recesses for accommodating electronic components each having a rectangular parallelepiped shape with a length dimension (L dimension) of less than or equal to 0.6 mm, a width dimension (W dimension) of less than or equal to 0.3 mm, and a height dimension (T dimension) of less than or equal to 0.3 mm, the accommodation recesses being configured continuously at predetermined intervals, the base tape including paper;
the electronic components accommodated in the accommodation recesses; and
a cover tape continuously adhered to a surface of the base tape so as to cover the accommodation recesses, wherein
the electronic components are lifted out from the accommodation recesses by peeling off the cover tape while conveying the base tape in one direction,
each of the accommodation recesses has a bottom surface inclined to be deeper toward a downstream in a conveyance direction, and
the bottom surface is inclined in a range of from more than 10° to 20° with respect to the surface of the base tape.

2. The electronic component series according to claim 1, wherein
a right angle is between the bottom surface of the accommodation recess and a side surface of the accommodation recess located on a downstream side in the conveyance direction,
a cutout portion is provided only on the side surface side of the accommodation recess located on the downstream side so as to provide a widened opening of the accommodation recess, and
a length D from a lowermost point to an uppermost point of the side surface of the accommodation recess located on the downstream side in contact with a corresponding electronic component in a direction along the side surface located on the downstream side is smaller than the T dimension of the electronic component.

3. The electronic component series according to claim 1, wherein
each of the accommodation recesses is inclined from one side to the other side in a width direction that is a short side direction of the base tape.

4. The electronic component series according to claim 2, wherein
each of the accommodation recesses is inclined from one side to the other side in a width direction that is a short side direction of the base tape.

5. An electronic component series comprising:
a base tape provided with a multiplicity of accommodation recesses for accommodating electronic components each having a rectangular parallelepiped shape with a length dimension (L dimension) of less than or equal to 0.6 mm, a width dimension (W dimension) of less than or equal to 0.3 mm, and a height dimension (T dimension) of less than or equal to 0.3 mm, the accommodation recesses being configured continuously at predetermined intervals;
the electronic components accommodated in the accommodation recesses; and
a cover tape continuously adhered to a surface of the base tape so as to cover the accommodation recesses, wherein
the electronic components are lifted out from the accommodation recesses by peeling off the cover tape while conveying the base tape in one direction,
each of the accommodation recesses has
a bottom surface having a surface parallel to the surface of the base tape,
a first side surface configured at a right angle with respect to the bottom surface on a downstream side in a conveyance direction, and
a second side surface configured at a right angle with respect to the bottom surface on an upstream side in the conveyance direction,
the bottom surface has
a placement portion for placing a corresponding electronic component, and
a guiding portion for guiding the electronic component to the placement portion, the guiding portion being provided between the placement portion and at least one of the first side surface and the second side surface, and
the guiding portion is an inclined surface inclined by more than or equal to 30° with respect to a surface of the placement portion.

6. The electronic component series according to claim 5, wherein
the guiding portion exists only on the second side surface side, and a relation between a width B of the guiding portion in the conveyance direction and the W dimension of the electronic component satisfies a condition of $0.7 \times (A-W) \leq B \leq 0.9 \times (A-W)$, where A represents a length of an opening portion of the accommodation recess in the conveyance direction.

7. The electronic component series according to claim 5, wherein
the guiding portion exists only on the second side surface side, and a cutout portion is configured only on the downstream side of the accommodation recess in the conveyance direction, and
a length D from a lowermost point to an uppermost point of the first side surface of the accommodation recess in contact with a corresponding electronic component in a direction along the first side surface is smaller than the T dimension of the electronic component.

8. The electronic component series according to claim 6, wherein
the base tape is an embossed tape composed of a resin, and
a center of the electronic component is located at a position on the downstream side in the conveyance direction relative to a center of the accommodation recess.

9. The electronic component series according to claim 5, wherein
a first guiding portion is provided between the first side surface and the placement portion,
a second guiding portion is provided between the second side surface and the placement portion,
a width $B_1$ of the first guiding portion in the conveyance direction is from 70% to 90% of a distance between a downstream end of the electronic component and the first side surface, and
a width $B_2$ of the second guiding portion in the conveyance direction is from 70% to 90% of a distance between an upstream end of the electronic component and the second side surface.

10. The electronic component series according to claim 5, wherein
the guiding portion is provided in the bottom surface of the accommodation recess on at least one of one side and the other side in a short side direction of the base tape.

11. The electronic component series according to claim 6, wherein
the guiding portion exists only on the second side surface side, and a cutout portion is configured only on the downstream side of the accommodation recess in the conveyance direction, and
a length D from a lowermost point to an uppermost point of the first side surface of the accommodation recess in contact with a corresponding electronic component in a direction along the first side surface is smaller than the T dimension of the electronic component.

12. The electronic component series according to claim 7, wherein
the base tape is an embossed tape composed of a resin, and
a center of the electronic component is located at a position on the downstream side in the conveyance direction relative to a center of the accommodation recess.

13. A base tape provided with a multiplicity of accommodation recesses for accommodating electronic components each having a rectangular parallelepiped shape with a length dimension (L dimension) of less than or equal to 0.6 mm, a width dimension (W dimension) of less than or equal to 0.3 mm, and a height dimension (T dimension) of less than or equal to 0.3 mm, the accommodation recesses being configured continuously at predetermined intervals, the base tape including paper, wherein
each of the accommodation recesses has a bottom surface inclined to be deeper toward a downstream in a conveyance direction, and
the bottom surface is inclined in a range of from more than 10° to 20° with respect to the surface of the base tape.

14. The base tape according to claim 13, wherein
a right angle is between the bottom surface of the accommodation recess and a side surface of the accommodation recess located on a downstream side in the conveyance direction,
a cutout portion is provided only on the side surface side of the accommodation recess located on the downstream side so as to provide a widened opening of the accommodation recess, and
a length D from a lowermost point to an uppermost point of the side surface of the accommodation recess located on the downstream side in contact with a corresponding electronic component in a direction along the side surface located on the downstream side is smaller than the T dimension of the electronic component.

* * * * *